United States Patent [19]

Spires

[11] Patent Number: 4,896,093

[45] Date of Patent: Jan. 23, 1990

[54] ELECTRONIC INDUCTOR

[75] Inventor: Dewayne A. Spires, Plaistow, N.H.

[73] Assignees: American Telephone and Telegraph Company, New York, N.Y.; AT&T Bell Laboratories, Murray Hill, N.J.

[21] Appl. No.: 234,662

[22] Filed: Aug. 22, 1988

[51] Int. Cl.$^4$ .............................................. G05F 1/24
[52] U.S. Cl. .................................. 323/259; 323/247; 323/263; 323/358; 379/378
[58] Field of Search ............... 323/247, 259, 262, 263, 323/328, 355, 358, 356, 357; 379/378, 284; 336/30

[56] References Cited

U.S. PATENT DOCUMENTS

| | | | |
|---|---|---|---|
| 3,714,548 | 1/1973 | MacRander | 323/356 |
| 3,761,797 | 9/1973 | Spooner | 323/259 |
| 3,896,366 | 7/1975 | Onogi | 323/328 |
| 3,959,718 | 5/1976 | Hasegawa | 323/356 |
| 4,046,967 | 9/1977 | O'Neill | 379/378 |
| 4,046,969 | 9/1977 | Dalley | 379/378 |
| 4,096,363 | 6/1978 | Earp | 323/357 |
| 4,467,269 | 8/1984 | Barzen | 323/356 |
| 4,767,980 | 8/1988 | Chen et al. | 323/356 |

FOREIGN PATENT DOCUMENTS

| | | | |
|---|---|---|---|
| 52570 | 3/1983 | Japan | 323/358 |
| 626673 | 7/1949 | United Kingdom | 323/259 |

OTHER PUBLICATIONS

M. S. Ghausi, *Electronic Devices and Circuits*, Holt, Rinehart & Winston, N.Y., 1985, pp. 426, 427.

Primary Examiner—William H. Beha, Jr.
Attorney, Agent, or Firm—Joseph A. Cameron

[57] ABSTRACT

To produce a high current carring inductor with a high inductance value in space normally too small, a transformer is chosen which meets space requirements and has a primary winding of sufficient current capacity, but too little inductance. A bidirectional current source drives the secondary winding under control of a feedback circuit in response to sensed primary winding current to effectively multiply the primary winding inductance.

6 Claims, 1 Drawing Sheet

ELECTRONIC INDUCTOR

TECHNICAL FIELD

This invention is in the field of electronic inductors, particularly those useful at low frequencies, such as telephone line circuit inductors.

Low frequency inductors used in telephone line circuits must be able to carry a substantial amount of dc current in order to pass signaling information, and yet have a high inductance value to avoid affecting the 400 Hz to 4 KHz voice frequency signals. Traditionally, these requirements translated into an inductor of large size and weight. The high current value requires heavy gauge wire; the high inductance value requires many turns; and the dc requires a large iron core to avoid saturation. With the micro-miniaturization of virtually all electronic equipment including telephone line circuits, there is an obvious need to greatly reduce the size and weight of the inductors.

Electronic inductors in which the inductance is synthesized with a capacitor and transistors can be used effectively to miniaturize many circuits. These known synthesized inductors have characteristics, however, that make them unsuitable for this application. First, in order to isolate the inductor from the reminder of the circuit, the transistors must be isolated and protected from lightning surges. Second, the ac voltage across the synthesized inductor must not be allowed to reverse bias the transistors. This means that the current cannot flow in one direction through the inductor in the presence of an opposite polarity voltage across the inductor. It also means that the synthesized inductor will not operate with zero dc current flowing. The synthesized inductor, therefore, does not behave like a true inductor.

SUMMARY OF THE INVENTION

These disadvantages are overcome by our invention in which a transformer primary winding is connected in place of the inductor in the circuit. Sensing means senses the current in the primary winding, and a bidirectional current source responsive to the sensing means drives the secondary winding to effectively increase the inductance effect of the primary winding.

DETAILED DESCRIPTION

Figure 1:
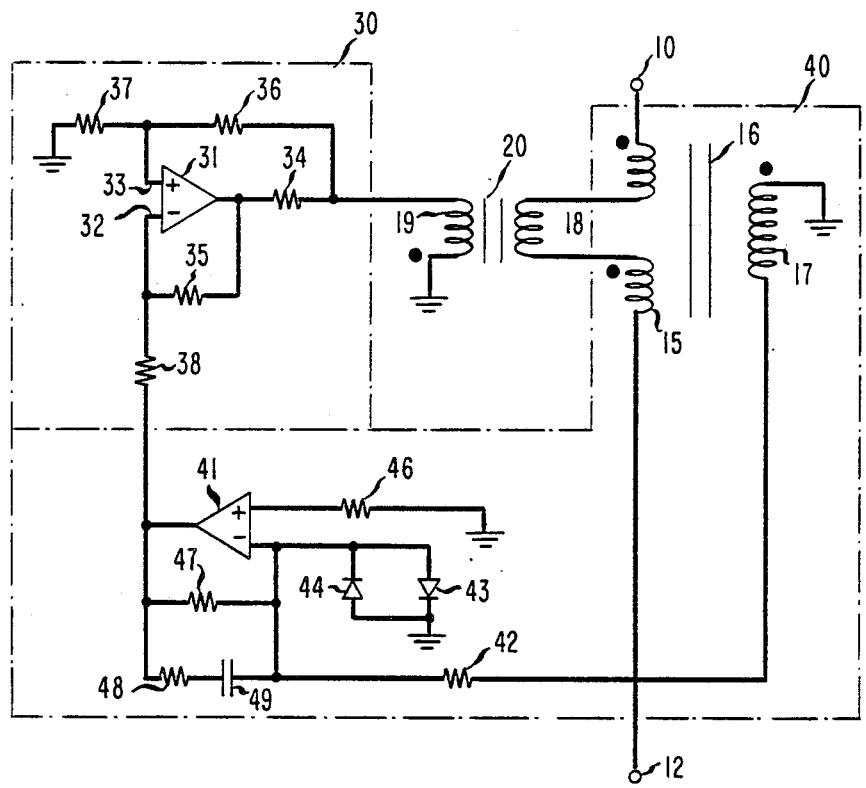
FIG. 1 is a schematic diagram of an embodiment of the invention.

A particularly useful embodiment of the invention is shown in the circuit diagram of FIG. 1. Referring to FIG. 1, connected in series between the inductor terminals 10 and 12, which may be the tip and ring terminals respectively of a telephone line circuit, are two halves 14 and 15 of the primary winding of a sensing transformer 16 and the primary winding 18 of inductance transformer 20. The secondary winding 19 of inductance transformer 20 is connected to the output of a bidirectional current source 30, which is in turn controlled by a control circuit 40 that includes sensing transformer 16.

Bidirectional current source 30 may comprise an operational amplifier 31, having an inverting input 32, and a non-inverting input 33. An output resistor 34 connects the output of operational amplifier 31 to secondary winding 19. A first feedback resistor 35 may connect the output of operational amplifier 31 to its inverting input 32, and a second feedback resistor 36 may connect secondary winding 19 of transformer 20 to the non-inverting input 33 of operational amplifier 31. A resistor 37 may connect non-inverting input 33 to ground, and a resistor 38 may connect inverting input 32 to the control circuit 40.

In order to control the current of current source 30 in response to the current in primary winding 18, control circuit 40 may comprise an operational amplifier 41 connected between secondary winding 17 of sensing transformer 40 and input resistor 38. A low value isolating resistor 42 may connect winding 17 to the inverting input of amplifier 41, and a pair of oppositely poled diodes 43 and 44, may couple this input to ground for lightning protection. An input resistor 46 may connect the non-inverting input of amplifier 41 to ground. Finally, a dc feedback resistor 47 and the ac feedback series combination of a resistor 48 and capacitor 49 may connect the inverting input and output of amplifier 41 to set the amplifier gain.

Figure 2:
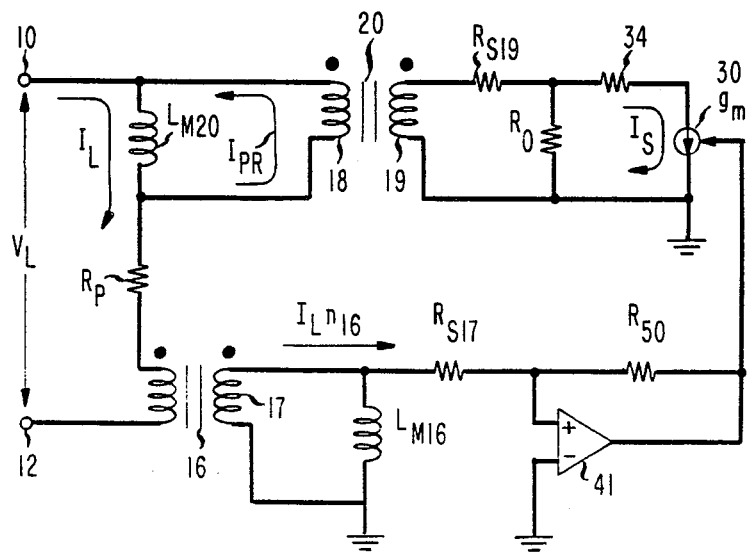
FIG. 2 is a simplified equivalent circuit of the embodiment of FIG. 1 useful in explaining the operation of the invention.

In explaining the operation of the embodiment of FIG. 1, we refer to the simplified circuit diagram of FIG. 2. In this diagram, transformers 16 and 20 are represented as ideal transformers; ie, leakage inductances are ignored, and winding resistances are lumped. With iron-cored transformers, these approximations are reasonable. Each transformer, therefore, has a magnetizing inductance $L_M$ in parallel with one winding. Resistor $R_P$ represents the primary winding resistance of transformers 16 and 20; $R_{S17}$ represents the combination of resistor 42 and the resistance of secondary winding 17; and $R_{S19}$ represents the resistance of secondary winding 19. $R_{50}$ represents the resistance of the parallel combination of resistors 47 and 48. Neglecting compensation for capacitor 49, this combination determines the gain of amplifier 41.

Current source 30 may be considered a transconductance amplifier with an output impedance $R_o$ and a transconductance $g_m$ equal to the ratio of its output current $I_o$ to its input voltage $V_i$. To determine these parameters we refer momentarily back to FIG. 1. For bidirectional current source operation the ratio of the value of the feedback resistor to the input resistor should be the same for both inverting and non-inverting inputs. That is, neglecting the low value of output resistor 34, $R_{36}/R_{37} = R_{35}/R_{38}$. The voltage gain $V_o/V_i$ of amplifier 31 is therefore $R_{35}/R_{38}$. Since $V_o$, however, is the product of $I_o$ and the value of resistor 34, i.e., $V_o = I_o R_{34}$, then by substitution, the transconductance of current source 30

$$g_m = \frac{I_o}{V_i} = \frac{\frac{V_o}{R_{34}}}{V_i} = \frac{R_{35}}{R_{38} \cdot R_{34}}.$$

Referring back to FIG. 2, the circuit operates to multiply inductance as follows: $V_L$ and $I_L$ represent the differential voltage and current, respectively, between inductor terminals 10 and 12, which, as previously mentioned, may be the tip and ring terminals of a telephone line circuit. Hence, the impedance of the inductor circuit $Z_L = V_L / I_L$. Transformer 16 senses the differential current $I_L$. The primary-to-secondary turns ratio $n_{16}$ is chosen to be a relatively small fraction to provide effective current sensing and present a low impedance in the primary circuit. The current delivered to the inverting input (virtual ground) of control amplifier 41 is $I_L n_{16}$. The product of this current and gain determining feedback resistance 50 is the output voltage of amplifier 41, which is supplied to transconductance amplifier 30. Multiplying this voltage by the $g_m$ gives the secondary current supplied to winding 19 of inductance transformer 20. That is, $$I_s = I_L \cdot n_{16} \cdot R_{50} \cdot g_m.$$

(The output impedance $R_o$ of the transconductance amplifier, given by $R_{36}+R_{37}$, is much larger than $R_{34}$ and $R_S 19$). This current, divided by the primary-to-secondary turns ratio $n_{20}$ of inductance transformer 20 forms the reflected primary current of transformer 20.

$$\therefore I_{PR} \approx \frac{I_S}{n_{20}}$$

and $$I_{PR} \approx \frac{I_L \cdot n_{16} \cdot R_{50} \cdot g_m}{n_{20}}.$$

Using Kirchoff's current law, the current $I_M$ in magnetizing inductance $L_{M20}$ is the sum of $I_L$ and $I_{PR}$. The voltage developed across $L_{M20}$ is $$j\omega(I_L + I_{PR})L_{M20}.$$

Since very little voltage is developed across the primary winding of sensing transformer 16, the inductor circuit voltage $$V_L \approx I_L \left( R_p + j\omega \left[ \frac{I_L + I_{PR}}{I_L} \right] L_{M20} \right)$$

, and the impedance of the entire circuit $$Z_L = R_p + j\omega \left( 1 + \frac{I_{PR}}{I_L} \right) L_{M20}.$$

The inductance of transformer 20 has therefor been multiplied by one plus the current gain around the feedback loop.

$$\frac{I_{PR}}{I_L} = \frac{n_{16} \cdot R_{50} \cdot g_m}{n_{20}}.$$

Current gains of the order of ten are readily realized, providing, for example, an inductance multiplication of eleven.

Although the described embodiment of my invention will operate with a very wide range of component parameters to provide inductance multipliers as explained, the design parameters of the inductance transformer 20 are important to achieve all of the requirements of a miniature telephone line circuit inductor.

The primary winding 18 must be capable of carrying the required dc current, must have a low enough resistance to meet requirements and yet must have enough inductance to keep the loop multiplication factor to a reasonable value. As any experienced designer knows, a feedback loop with too high a loop multiplication factor can become uncontrolled and/or impossible to compensate. Therefore, most of the winding volume of the transformer will normally be taken up by this winding. On the other hand, if the turns ratio $n_{20}$ is too high, amplifier 31 will not have enough current drive or voltage swing, as limited by resistor 34 and the secondary winding resistance transformer $R_{S19}$. An experienced designer of ordinary skill can maximize the inductance of this transformer while minimizing the dc resistance within the allowable physical package.

The design parameters of transformer 16 on the other hand are not critical even to meet the difficult requirements of a telephone line circuit miniature inductor. In fact, transformer 16 can readily be replaced by any equivalent sensing means without losing the advantages of, or departing from the spirit and scope of my invention. By way of example and not limitation, a sensing resistor and differential amplifier will function quite well. The two main design considerations for a sensing means in the case of telephone line circuit inductors are excellent longitudinal balance and a relatively low resistance in the inductance path. Most of the allowable resistance will be taken up by transformer 20.

Obviously, when a transformer is used for inductor current sensing, its primary, or sensing winding must be able to carry the full dc current of the inductor. The turns ratio $M_{16}$ is flexible because the feedback loop can be designed to accommodate a wide range of values.

I have described an embodiment of my invention that is particularly suited to use in telephone line circuits. My invention is not limited to that application, however. Since this electronic inductor acts as a true inductor over a frequency range limited only by the passband of the feedback loop, it can advantageously be used in almost any application where a higher inductance is needed than can be obtained by a normal inductor within the allotted dimensions.

I claim:
1. An electronic inductor comprising:
   an inductance transformer (20) having a primary inductance winding (18) and a secondary inductance winding (19);
   current sensing means (16) for sensing the current in the primary inductance winding;
   a bidirectional current source (20) connected to said secondary inductance winding; and
   control means (41) reponsive to said current sensing means and connected to said bidirectional current source for controlling the current in said secondary inductance winding to substantially increase the inductance effect of said primary inductance winding.

2. An electronic inductor, as in claim 1, wherein said inductance transformer has a magnetic core.

3. An electronic inductor, as in claim 2, wherein said current sensing means comprises a current sensing transformer having a primary sensing winding connected in series with said primary inductance winding and a secondary sensing winding.

4. An electronic inductor, as in claim 2, wherein said bidirectional current source comprises:
   an operational amplifier (31) having an inverting input (32), a non-inverting input (33) and an output;
   output resistance means (34) connected between said operational amplifier output and said secondary inductance winding;

a first feedback resistance (35) connected between said output and said inverting input;

a second feedback resistance (36) connected between said secondary inductance means and said non-inverting input;

a first input resistance (38) connected between said control means and said inverting input; and second input resistance (37) connected between said non-inverting input and circuit ground; and wherein the ratio of said first feedback resistance to said first input resistance is substantially equal to that of said second feedback resistance to said second input resistance.

5. An electronic inductor, as in claim 2, wherein the primary to secondary turns ratio of said inductance transformer is less than 10.

6. An electronic inductor, as in claim 4, wherein the primary to secondary turns ratio of said inductance transformer is less than 10.

* * * * *